United States Patent
Lee et al.

(10) Patent No.: US 10,492,338 B2
(45) Date of Patent: Nov. 26, 2019

(54) SERVER ROOM COOLING DEVICE, FILTER MODULE FOR INTRODUCING OUTER AIR, AND DATA CENTER AIR-CONDITIONING SYSTEM COMPRISING SAME

(71) Applicant: NAVER BUSINESS PLATFORM CORPORATION, Seongnam-si (KR)

(72) Inventors: Dong Ju Lee, Seongnam-si (KR); Weon Gi Park, Seongnam-si (KR); Ji Hyun Koo, Seongnam-si (KR); Keun Ho Ryu, Seongnam-si (KR); Jeong Beom Ko, Seongnam-si (KR); Hun Nam Ji, Seongnam-si (KR)

(73) Assignee: NAVER Business Platform Corporation, Seongnam-si (KR)

( * ) Notice: Subject to any disclaimer, the term of this patent is extended or adjusted under 35 U.S.C. 154(b) by 446 days.

(21) Appl. No.: 15/109,999

(22) PCT Filed: Dec. 5, 2014

(86) PCT No.: PCT/KR2014/011922
§ 371 (c)(1),
(2) Date: Jul. 6, 2016

(87) PCT Pub. No.: WO2015/102247
PCT Pub. Date: Jul. 9, 2015

(65) Prior Publication Data
US 2016/0353612 A1    Dec. 1, 2016

(30) Foreign Application Priority Data

Jan. 6, 2014  (KR) .................... 10-2014-0001496
Feb. 3, 2014  (KR) .................... 10-2014-0012217

(51) Int. Cl.
*H05K 7/20*    (2006.01)
*F24F 3/16*    (2006.01)
*F24F 5/00*    (2006.01)

(52) U.S. Cl.
CPC ....... *H05K 7/20745* (2013.01); *F24F 3/1603* (2013.01); *F24F 5/0035* (2013.01); *H05K 7/208* (2013.01)

(58) Field of Classification Search
CPC .. F24F 3/1603; F24F 5/0035; H05K 7/20745; H05K 7/208
See application file for complete search history.

(56) References Cited

U.S. PATENT DOCUMENTS

| | | | | |
|---|---|---|---|---|
| 5,324,229 A | * | 6/1994 | Weisbecker | ............ F24F 13/04 236/49.3 |
| 9,072,201 B2 | * | 6/2015 | Bean, Jr. | ............ H05K 7/20345 |

(Continued)

FOREIGN PATENT DOCUMENTS

| CN | 102052745 A | 5/2011 |
|---|---|---|
| CN | 202648013 U | 1/2013 |

(Continued)

OTHER PUBLICATIONS

JP2012177521A translation.*

(Continued)

*Primary Examiner* — Jon T. Schermerhorn, Jr.
(74) *Attorney, Agent, or Firm* — Greer, Burns & Crain, Ltd.

(57) ABSTRACT

Provided is a server room cooling device including: an outer air inflow unit into which outer air flows; a filter unit provided at one side of the outer air inflow unit and filtering the outer air supplied through the outer air inflow unit; a mist ejection unit provided at one side of the filter unit and ejecting mist into the outer air that has passed through the (Continued)

filter unit; and a supply unit provided at one side of the mist ejection unit and supplying the outer air that has passed through the mist ejection unit to a server room.

18 Claims, 10 Drawing Sheets

(56) References Cited

U.S. PATENT DOCUMENTS

| | | | | |
|---|---|---|---|---|
| 9,420,725 | B2* | 8/2016 | Honda | F24F 1/0007 |
| 2010/0300650 | A1* | 12/2010 | Bean, Jr. | H05K 7/20345 |
| | | | | 165/67 |
| 2010/0317278 | A1 | 12/2010 | Novick | |
| 2011/0056651 | A1* | 3/2011 | Monk | F24F 11/0001 |
| | | | | 165/80.2 |
| 2013/0098597 | A1* | 4/2013 | Fujimoto | H05K 7/20745 |
| | | | | 165/287 |
| 2013/0238141 | A1 | 9/2013 | Shimizu | |
| 2014/0349563 | A1* | 11/2014 | Honda | F24F 1/0007 |
| | | | | 454/184 |
| 2017/0043438 | A1* | 2/2017 | Park | B23P 15/26 |

FOREIGN PATENT DOCUMENTS

| | | |
|---|---|---|
| CN | 103375857 A | 10/2013 |
| DE | 20 2009 013 664 U1 | 2/2010 |
| EP | 2 587176 A2 | 5/2013 |
| JP | 2010144949 | 7/2010 |
| JP | 2010261696 A | 11/2010 |
| JP | 2011196657 A | 10/2011 |
| JP | 2012002390 A | 1/2012 |
| JP | 2012098799 A | 5/2012 |
| JP | 2012-177521 | 9/2012 |
| JP | 2013092298 A | 5/2013 |
| JP | 2013-213616 | 10/2013 |
| JP | 2013-214293 | 10/2013 |
| JP | 2013253753 A | 12/2013 |
| KR | 101256367 | 4/2013 |
| KR | 101295311 | 8/2013 |
| WO | WO 2013/108495 A1 | 7/2013 |

OTHER PUBLICATIONS

KR101256367 translation.*
2nd Office Action issued in corresponding Chinese Patent application No. 201480068728.6, dated Dec. 28, 2018 (with translation).
1st Office Action issued in corresponding Japanese Patent application No. 2016-562714, dated Jun. 12, 2018.
Korean Office Action dated Jan. 26, 2017 of the corresponding Korean Patent application No. 10-2014-0001496.
International Search Report corresponding to PCT/KR2014/011922 dated Feb. 25, 2015 (with English language translation).
First Office Action issued in corresponding Chinese Patent Application No. 201480068728.6, dated May 2, 2018 (with translation).
Extended EP search report issued in corresponding European Patent Application No. 14877112.4, dated Aug. 16, 2017.
2nd Office Action issued in corresponding Japanese Patent application No. 2016-562714, dated Feb. 26, 2019.
Office Action issued in corresponding Japanese patent application No. 2016-562714, dated Sep. 24, 2019.

* cited by examiner

SERVER ROOM COOLING DEVICE, FILTER MODULE FOR INTRODUCING OUTER AIR, AND DATA CENTER AIR-CONDITIONING SYSTEM COMPRISING SAME

CROSS-REFERENCE TO RELATED APPLICATIONS

This application is a U.S. National Phase Application under 35 U.S.C. § 371 of International Application No. PCT/KR2014/011922 filed on Dec. 5, 2014, which claims the benefit of priority from Korean Patent Application No. 10-2014-0001496, filed on Jan. 6, 2014 and Korean Patent Application No. 10-2014-0012217, filed on Feb. 3, 2014. The disclosure of International Application No. PCT/KR2014/011922 and Korean Patent Application Nos. 10-2014-0001496 and 10-2014-0012217 are incorporated herein by reference.

TECHNICAL FIELD

One or more embodiments relate to a server room cooling device that cools a server room by using external natural air, and an air-conditioning system of a data center, the air-conditioning system including the server room cooling device.

BACKGROUND OF THE INVENTION

A server, network equipment, enterprise equipment, etc. included in a data center generate heat. Accordingly, the data center operating such pieces of equipment also requires large scale facilities for reducing heat.

In order to cool the heat of the data center, cold air is supplied to each piece of equipment, and in this regard, a thermostat that is used to generate cold air is generally used.

However, energy consumed to activate the thermostat and facilities connected to the thermostat is about 50 to 60% of entire electricity used in the data center. Accordingly, in order to reduce an amount of energy used to cool the data center, a method of reducing the heat of the pieces of equipment by introducing cold air from outside a building into a server room has been recently introduced.

In this regard, KR 10-2011-0129514 (published on Dec. 2, 2011) "Air Conditioning System of Internet Data Center for Green Computing Environment" discloses technology in which outer air is controlled to be introduced to a data center, is cooled through a cooling unit, and is introduced into the data center.

Information disclosed in this Background section was already known to the inventors before achieving the inventive concept or is technical information acquired in the process of achieving the inventive concept. Therefore, it may contain information that does not form the prior art that is already known to the public.

SUMMARY OF THE INVENTION

One or more embodiments include a server room cooling device capable of maintaining a suitable temperature and humidity of a data center by using outer air, and an air-conditioning system of the data center, the air-conditioning system including the server room cooling device.

Also, one or more embodiments include a server room cooling device capable of reducing an amount of energy consumed to cool a data center, and an air-conditioning system of the data center, the air-conditioning system including the server room cooling device.

Also, one or more embodiments include a server room cooling device capable of increasing a period of cooling a data center by using outer air, and an air-conditioning system of the data center, the air-conditioning system including the server room cooling device.

Also, one or more embodiments include a server room cooling device capable of effectively blocking foreign substances included in outer air and reducing maintenance expenses, and an air-conditioning system of a data center, the air-conditioning system including the server room cooling device.

Also, one or more embodiments include a server room cooling device suitable for environment conditions that change a lot according to temperature/humidity states of outer air, and an air-conditioning system of a data center, the air-conditioning system including the server room cooling device.

Also, one or more embodiments include a server room cooling device in which a first supply unit is configured to perform an operation of an emergency outer air introducing unit such that outer air is immediately supplied into a server room during an emergency, such as system malfunction, to prevent a temperature in the server room from increasing, and an air-conditioning system of a data center, the air-conditioning system including the server room cooling device.

Also, one or more embodiments include a server room cooling device capable of intactly using an existing structure of a data center while connecting a server room and the server room cooling device, and an air-conditioning system of the data center, the air-conditioning system including the server room cooling device.

Also, one or more embodiments include a server room cooling device in which space utility inside a data center is increased since a space for installing a thermostat and for supplying cool air is not required to be separately provided, and an air-conditioning system of the data center, the air-conditioning system including the server room cooling device.

Also, one or more embodiments include an air-conditioning system of a data center, which includes an additional outer air introducing filter module for supplying outer air to increase an amount of outer air introduced into the data center, and prevent a temperature in a server room from increasing by immediately supplying outer air into the server room during an emergency, such as system malfunction.

According to one or more embodiments, an air-conditioning system of a data center includes: one or more outer air introducing filter modules provided at one side of a server room to supply outer air to the server room; and a server room cooling device provided at another side of the server room and ejecting mist into the outer air and providing the outer air to the server room.

Outer air may be supplied to the server room by the one or more outer air introducing filter modules if the server room cooling device malfunctions.

The server room cooling device may include: an outer air inflow unit into which outer air flows; a mist ejection unit provided at one side of the outer air inflow unit and ejecting mist into outer air that has passed through the outer air inflow unit; and a supply unit provided at one side of the mist ejection unit and supplying outer air that passed through the mist ejection unit to the server room.

The server room cooling device may further include a filter unit provided between the outer air inflow unit and the mist ejection unit to filter outer air supplied through the outer air inflow unit.

The air-conditioning system may further include a thermostat that is used to cool air inside the server room or the outer air, wherein the thermostat may be operated according to a temperature and humidity of outer air such that the air inside the server room is cooled.

According to one or more embodiments, a server room cooling device includes: an outer air inflow unit into which outer air flows; a filter unit provided at one side of the outer air inflow unit and filtering the outer air supplied through the outer air inflow unit; a mist ejection unit provided at one side of the filter unit and ejecting mist into the outer air that has passed through the filter unit; and a supply unit provided at one side of the mist ejection unit and supplying the outer air that has passed through the mist ejection unit to a server room.

The outer air inflow unit may include a first damper controlling closing and opening of the outer air inflow unit.

The outer air inflow unit may further include a demister filter blocking moisture or a foreign substance included in the outer air, wherein the demister filter may be provided at one side of the first damper.

A plurality of the demister filters may be provided, wherein the plurality of demister filters may be arranged at one side of the first damper in a zigzag shape.

A return duct unit to which return air that has passed through the server room is supplied may be connected to the outer air inflow unit.

A second damper controlling air flow between the outer air inflow unit and the return duct unit may be provided between the outer air inflow unit and the return duct unit.

The filter unit may be provided in a direction substantially perpendicular to an outer air inflow direction of the outer air inflow unit, with respect to the outer air inflow unit.

The server room cooling device may further include a cooling unit provided between the mist ejection unit and the supply unit to cool the outer air that has passed through the mist ejection unit.

The cooling unit may be provided inside the server room cooling device.

The supply unit may include a first supply unit provided at one side of the mist ejection unit and supplying the outer air that has passed through the mist ejection unit to the server room.

A first supply damper controlling an air flow between the first supply unit and the server room may be provided between the first supply unit and the server room.

When the first supply damper is opened, the outer air that flows into the outer air inflow unit may be supplied into the server room.

The server room cooling device may further include a second supply unit provided at one side of the first supply unit and supplying at least a part of the outer air that has passed through the mist ejection unit to the server room.

The second supply unit may include a blast fan guiding a flow of the outer air such that at least a part of the outer air that has passed through the mist ejection unit is supplied to the server room.

The second supply unit may be provided in a direction substantially perpendicular to an outer air inflow direction of the outer air inflow unit, with respect to the first supply unit.

A second supply damper controlling an air flow between the second supply unit and the server room may be provided between the second supply unit and the server room.

The filter unit, the mist ejection unit, and the supply unit may be arranged linearly.

According to one or more embodiments, an air-conditioning system of a data center comprises a server room cooling device which includes: an outer air inflow unit into which outer air flows; a filter unit provided at one side of the outer air inflow unit and filtering the outer air supplied through the outer air inflow unit; a mist ejection unit provided at one side of the filter unit and ejecting mist into the outer air that has passed through the filter unit; and a supply unit provided at one side of the mist ejection unit and supplying the outer air that has passed through the mist ejection unit to a server room, wherein the server room cooling device is provided at one side of the server room including a plurality of server racks arranged along a first direction to supply the outer air to the server room.

At least one cool zone, which is provided in a space between neighboring server racks and receiving the outer air from the server room cooling device, may be opened with respect to the server room cooling device, at least one hot zone, which is provided in a space between neighboring server racks and discharging the outer air received by the at least one cool zone after the outer air passes through servers included in the plurality of server racks, may be blocked with respect to the server room cooling device, and the at least one cool zone and the at least one hot zone may be alternately provided.

The air-conditioning system may further include a discharging unit that externally discharges the outer air supplied from the server room cooling device, wherein the discharging unit may be connected to the at least one hot zone.

One side of the discharging unit may be connected to a return duct unit of the server room cooling device, wherein at least some of the outer air supplied from the server room cooling device may be providable back to the server room cooling device through the return duct unit.

The air-conditioning system may further include a plurality of the server room cooling devices provided along the first direction, wherein the plurality of server room cooling devices may be opened such that air flows therebetween.

At least a part of the supply unit may be provided to face the plurality of server racks in the server room.

An existing structure of the server room may be usable as it is.

When any one of the supply units malfunction, air volume of remaining supply units may be increased to uniformly maintain total air volume.

According to one or more embodiments, one or more outer air introducing filter modules provided at one side of a server room to supply outer air to the server room, includes a filter blocking moisture or a foreign substance included in the outer air or a damper controlling inflow of the outer air.

The filter may include a demister filter or roll filter blocking the moisture or the foreign substance included in the outer air.

The one or more outer air introducing filter modules may be formed directly at one side surface of the server room to directly supply the outer air to the server room.

A plurality of the outer air introducing filter modules may be provided in parallel along a first direction.

The outer air may be supplied to the server room by the one or more outer air introducing filter modules when a server room cooling device malfunctions.

An existing structure of the server room may be usable as it is.

These and/or other aspects will become apparent and more readily appreciated from the following description of the embodiments, taken in conjunction with the accompanying drawings.

ADVANTAGEOUS EFFECTS

A server room cooling device and an air-conditioning system of a data center, the air-conditioning system including the server room cooling device, according to embodiments, may be operated year-round, without stopping even under environment conditions in which temperature/humidity states change a lot, by spraying mist into outer air fed in from outside a building to supply cold air into a server room, thereby remarkably reducing an amount of energy consumed to cool the data center.

Also, a server room cooling device and an air-conditioning system of a data center, the air-conditioning system including the server room cooling device, according to embodiments, may block foreign substances included in outer air by using a double filter automatically replaced based on a contamination level, thereby effectively blocking the foreign substances and reducing expenses consumed for maintenance.

Also, a server room cooling device and an air-conditioning system of a data center, the air-conditioning system including the server room cooling device, according to embodiments, may measure a temperature and humidity of outer air fed in from outside a building and adjust a spray amount of mist based on the temperature and the humidity, and thus may be optimally operated even under environment conditions in which temperature/humidity states of outer air change a lot.

Also, a server room cooling device and an air-conditioning system of a data center, the air-conditioning system including the server room cooling device, according to embodiments, may prevent a temperature inside a server room from increasing by immediately supplying outer air into the server room during an emergency, such as system malfunction.

Also, by using a server room cooling device and an air-conditioning system of a data center, the air-conditioning system including the server room cooling device, according to embodiments, space utility inside the data center may be increased.

Also, by using a server room cooling device and an air-conditioning system of a data center, the air-conditioning system including the server room cooling device, according to embodiments, an existing structure of the data center may not be changed and intactly used while connecting a server room and the server room cooling device.

Also, by using an air-conditioning system of a data center, according to embodiments, an amount of outer air introduced into the data center may be maximized, and outer air is immediately supplied into a server room during an emergency, such as system malfunction, to prevent a temperature inside the server room from increasing.

DETAILED DESCRIPTION OF THE INVENTION

Figure 1:
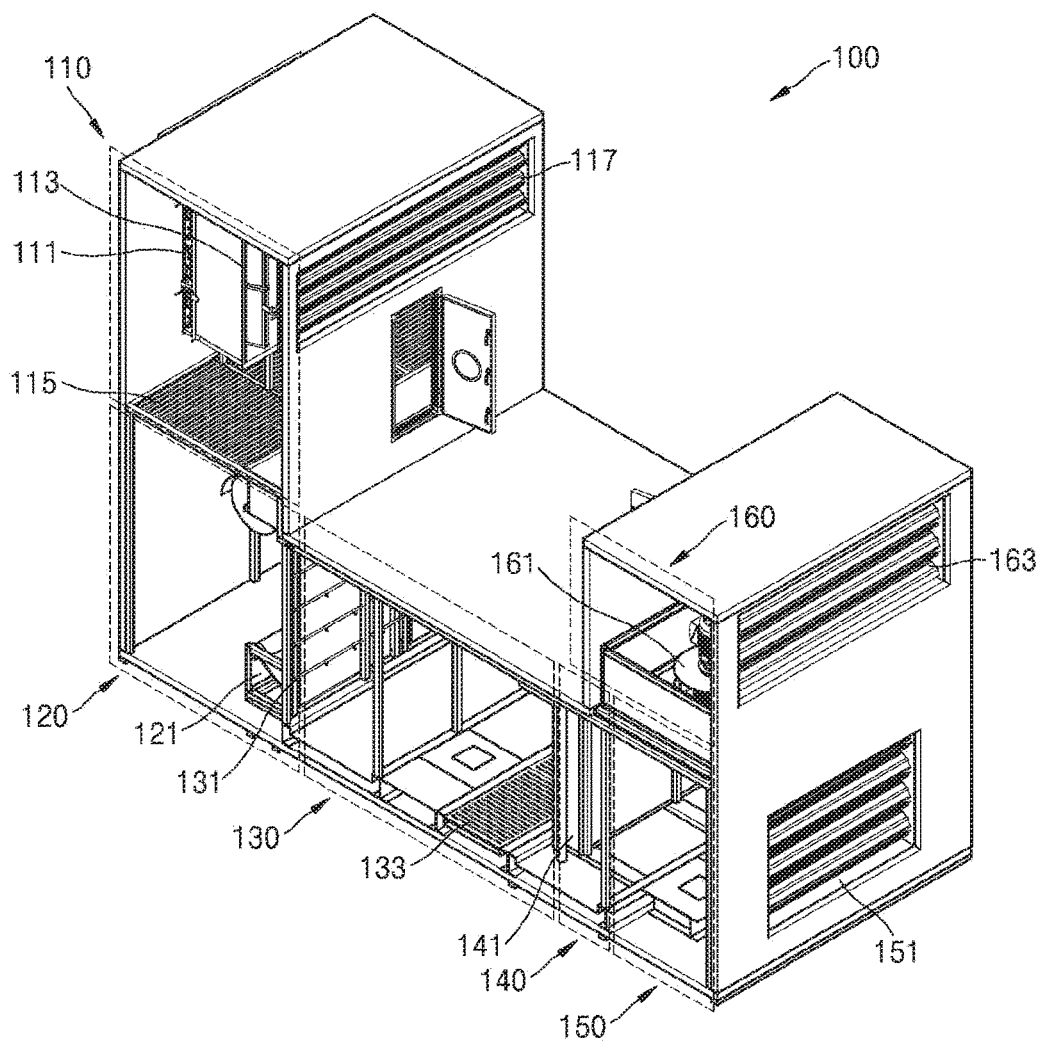
FIG. 1 is a perspective view of a server room cooling device according to an embodiment.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description. While such terms as "first", "second", etc., may be used to describe various components, such components must not be limited to the above terms. The above terms are used only to distinguish one component from another. An expression used in the singular encompasses the expression of the plural, unless it has a clearly different meaning in the context. In the present specification, it is to be understood that the terms such as "including" or "having," etc., are intended to indicate the existence of the features or components, and are not intended to preclude the possibility that one or more other features or components may exist or may be added. In drawings, for convenience of description, sizes of components may be exaggerated for clarity. For example, since sizes and thicknesses of components in drawings are arbitrarily shown for convenience of description, the sizes and thicknesses are not limited thereto.

Hereinafter, one or more embodiments will be described in detail with reference to accompanying drawings. In drawings, like reference numerals refer to like elements throughout and overlapping descriptions shall not be repeated.

Figure 2:
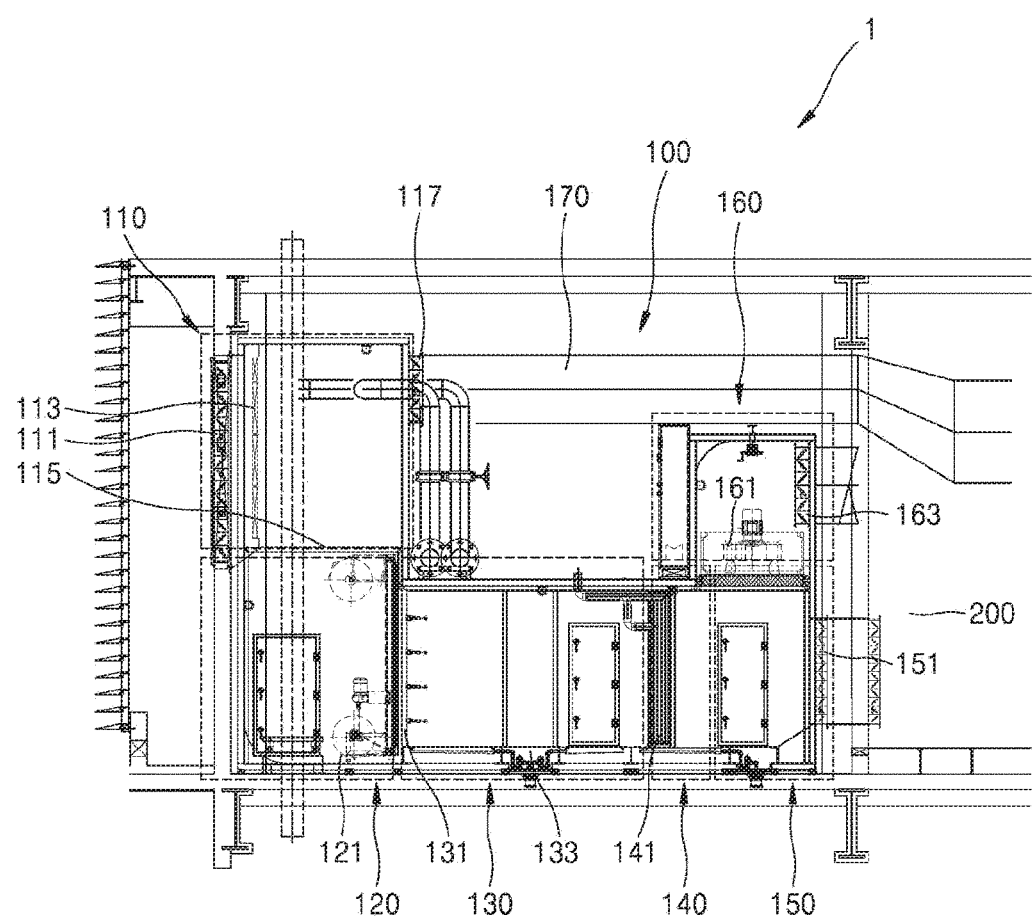
FIG. 2 is a lateral view of the server room cooling device of FIG. 1.
Figure 4:
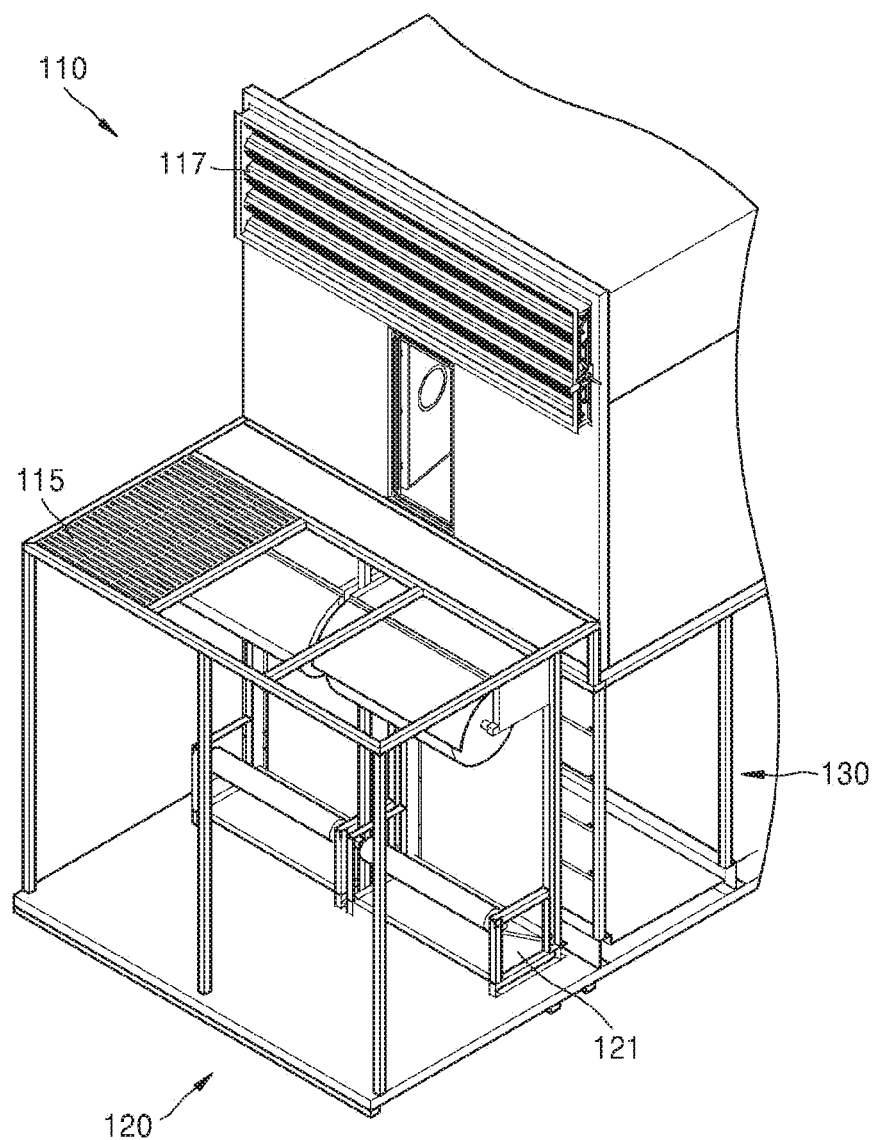
FIG. 4 is a perspective view illustrating in detail a filter unit of the server room cooling device of FIG. 1.
Figure 5:
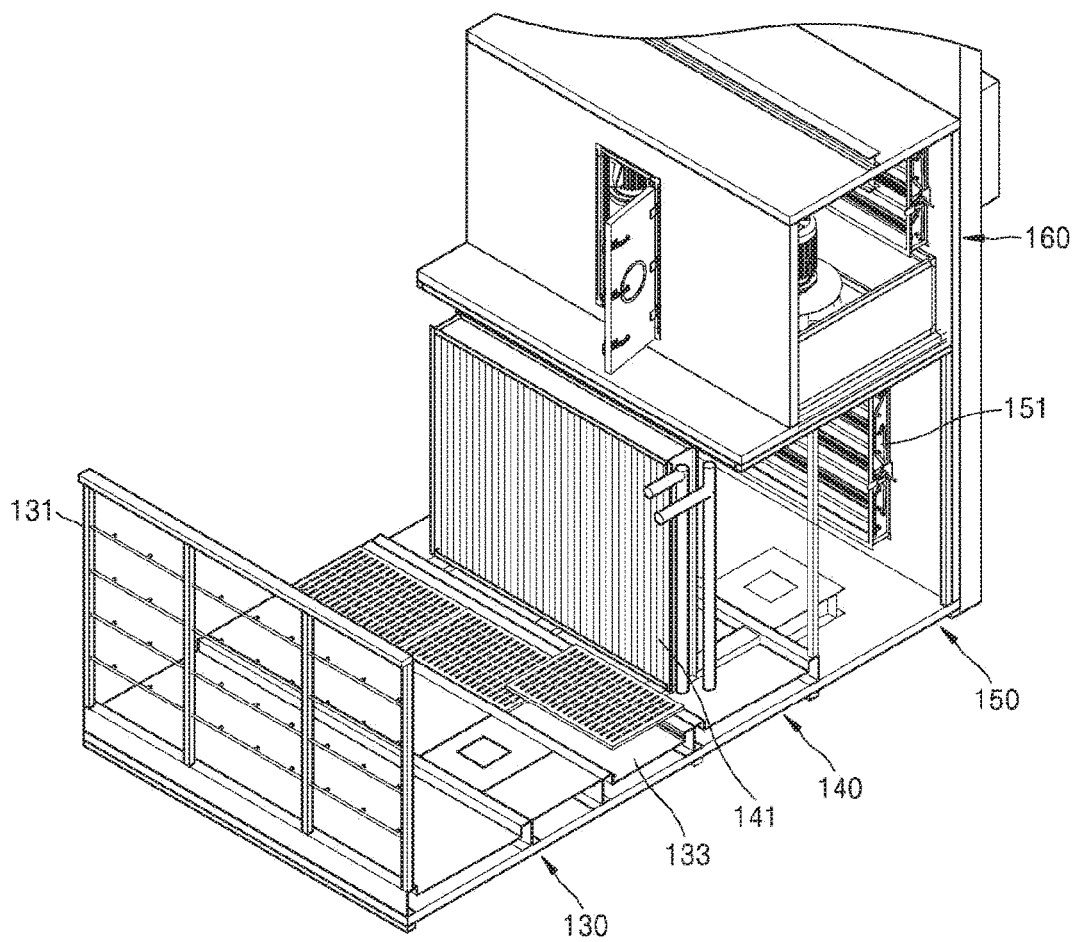
FIG. 5 is a perspective view illustrating in detail a mist ejection unit and a cooling unit of the server room cooling device of FIG. 1.
Figure 6:
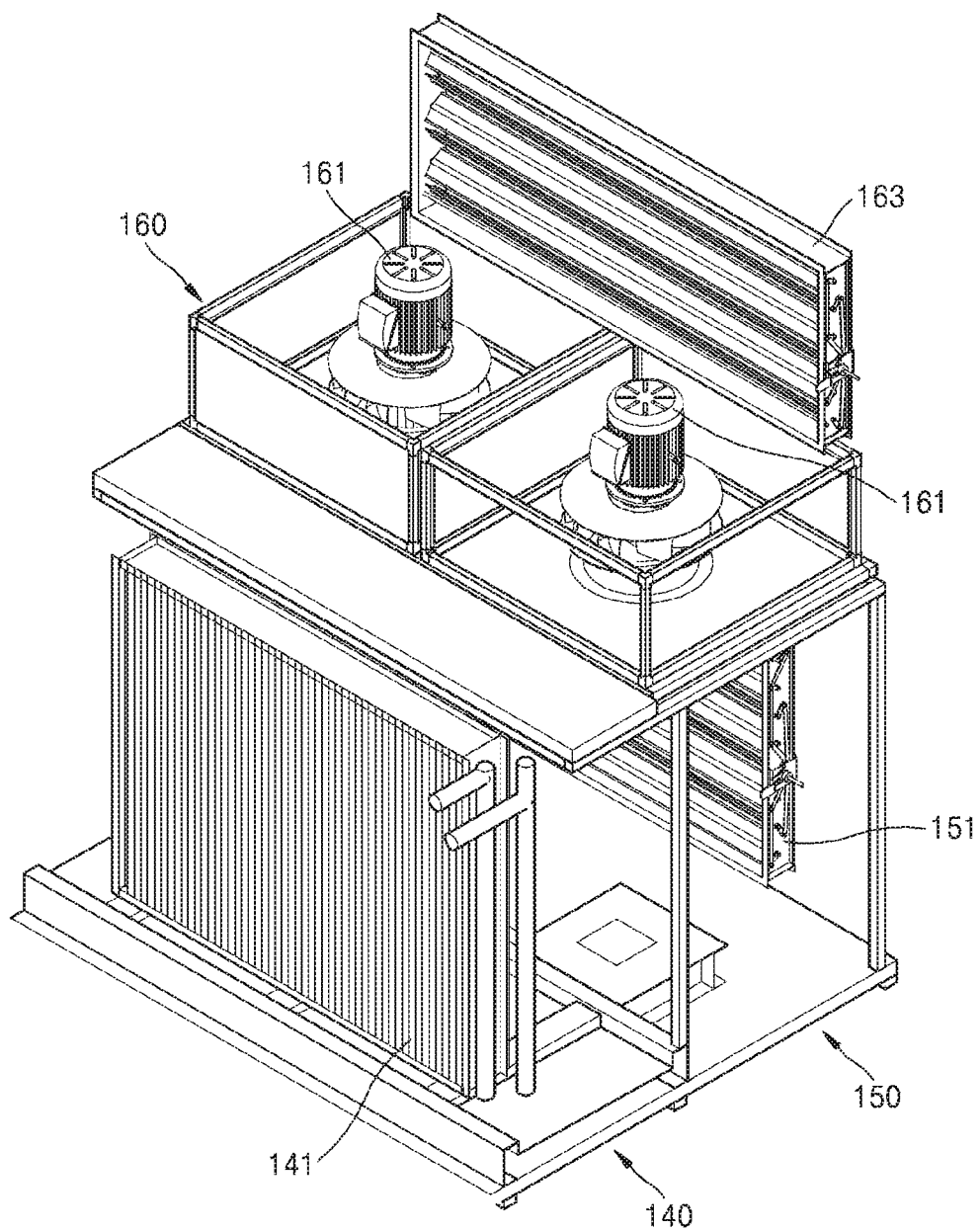
FIG. 6 is a perspective view illustrating in detail a first supply unit and a second supply unit of the server room cooling device of FIG. 1.

FIG. 1 is a perspective view of a server room cooling device according to an embodiment, FIG. 2 is a lateral view of the server room cooling device of FIG. 1. Meanwhile, FIG. 3 is a perspective view illustrating in detail an outer air inflow unit of the server room cooling device of FIG. 1, FIG. 4 is a perspective view illustrating in detail a filter unit of the server room cooling device of FIG. 1, FIG. 5 is a perspective view illustrating in detail a mist ejection unit and a cooling unit of the server room cooling device of FIG. 1, and FIG. 6 is a perspective view illustrating in detail a first supply unit and a second supply unit of the server room cooling device of FIG. 1.

First, referring to FIGS. 1 and 2, a server room cooling device 100 according to an embodiment includes an outer air inflow unit 110, a filter unit 120, a mist ejection unit 130, a cooling unit 140, a first supply unit 150, and a second supply unit 160.

The server room cooling device 100 using outer air according to an embodiment supplies cold outer air to a place where heat needs to be reduced, such as a data center, and cools the inside of a server room at a low cost by using outer air (for example, air outside a building) year-round without stopping even under environment conditions that change a lot according to temperature/humidity states. The server room cooling device 100 will now be described in detail.

Figure 3:
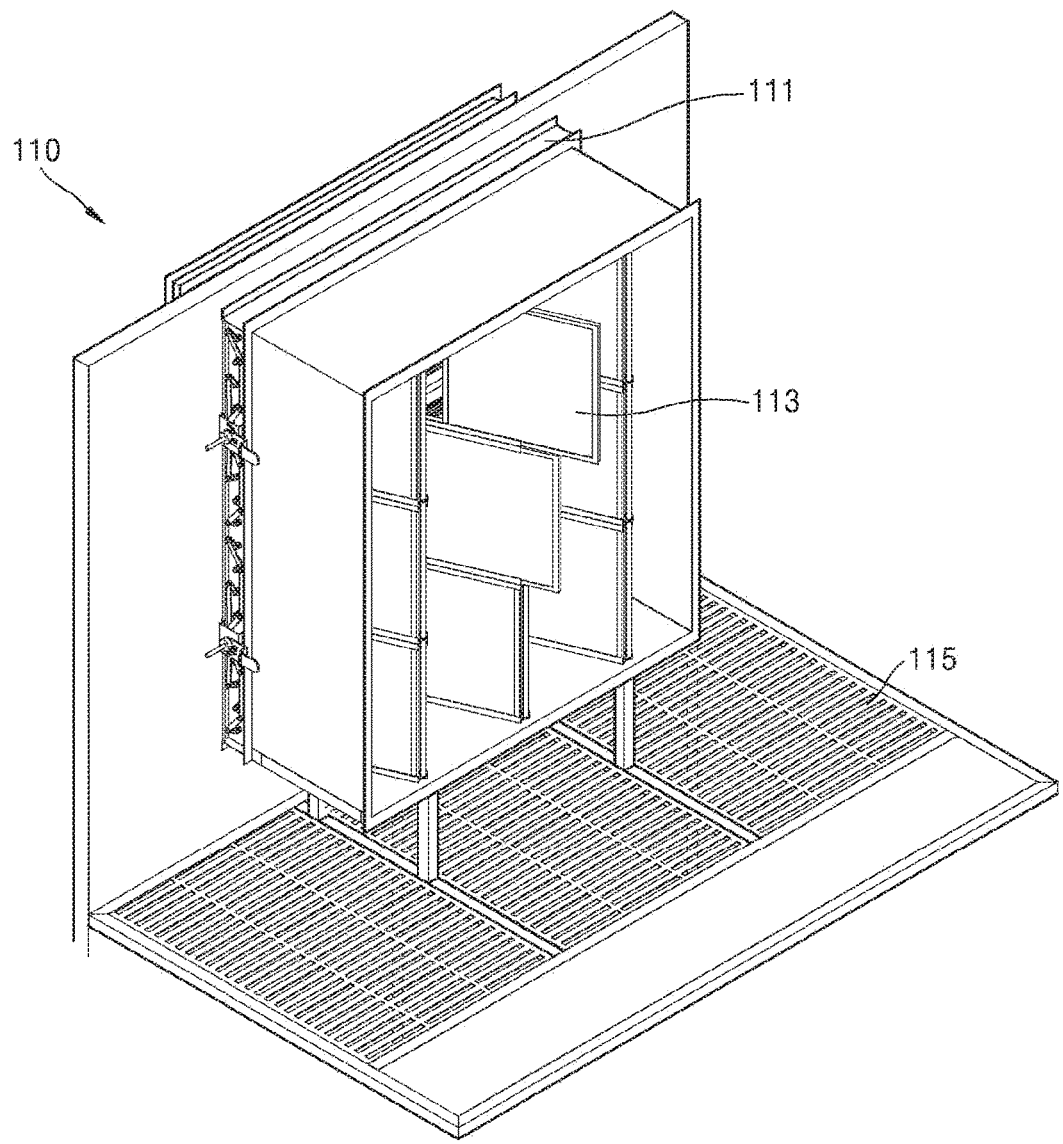
FIG. 3 is a perspective view illustrating in detail an outer air inflow unit of the server room cooling device of FIG. 1.

Referring to FIGS. 1 through 3, the outer air inflow unit 110 introduces air outside the server room cooling device 100 into the server room cooling device 100. Such an outer air inflow unit 110 includes an outside air (OA) damper 111, a demister filter 113, a grating unit 115, and a return air (RA) damper 117. Also, although not shown in the drawings, the outer air inflow unit 110 may further include a certain mesh (not shown) between the OA damper 111 and the demister filter 113.

The OA damper 111 controls opening and closing of the outer air inflow unit 110 to control an amount of the outer air flowing in through the outer air inflow unit 110. An example of the OA damper 111 includes a motor damper (MD) that is automatically opened or closed by an electric motor or an air pressure.

The demister filter 113 is an apparatus that removes moisture or foreign substances in vapor, and is manufactured by stacking a plurality of meshes or by charging an object in a fiber state. Such a demister filter 113 is formed to have low resistance, high particle collection efficiency, and high level of corrosion resistance, is simply cleaned, and is conveniently handled as it is lightweight.

Here, the outer air inflow unit 110 of the server room cooling device 100 according to an embodiment includes the mesh (not shown) and the demister filter 113 immediately adjacent to the OA damper 111 into which outer air flows, such that foreign substances included in the outer air do not enter into the server room cooling device 100. In other words, the outer air inflow unit 110 includes the mesh (not shown) immediately adjacent to the OA damper 111 to prevent a bird or a large insect from entering, and includes the demister filter 113 therein to remove the foreign substances entering the server room cooling device 100. Here, a plurality of the demister filters 113 may be included, and as shown in FIG. 3, the plurality of demister filters 113 may be arranged in a zigzag to process large air volume, thereby increasing an installation area.

The grating unit 115 including a plurality of openings may be provided on a lower bottom surface of the outer air inflow unit 110, i.e., on a surface of the outer air inflow unit 110 connected to the filter unit 120, to transmit outer air flowed in to the outer air inflow unit 110 to the filter unit 120.

Meanwhile, a return duct unit 170 to which return air that has passed through the server room may be connected to one side of the outer air inflow unit 110, and the RA damper 117 for controlling an air flow between the outer air inflow unit 110 and the return duct unit 170 may be further provided between the outer air inflow unit 110 and the return duct unit 170. The RA damper 117 adjusts a mixing ratio of outer air and return air to control a temperature of air supplied into the server room cooling device 100 to maintain a suitable level.

Meanwhile, a case forming an external shape of the outer air inflow unit 110 may be formed of, for example, urethane, and an overall internal and external sealing operation may be performed on the case such that air does not leak. Also, although not shown in drawings, a demister filter differential pressure gauge (not shown) may be additionally provided in the outer air inflow unit 110 to check differential pressure of a filter.

The demister filter 113 of the outer air inflow unit 110 and a roll filter 121 of the filter unit 120 blocks foreign substances, such as dust, included in outer air, thereby preventing a server, network equipment, or enterprise equipment in the server room from malfunctioning.

Then, referring to FIGS. 1, 2, and 4, the filter unit 120 is provided at one side of the outer air inflow unit 110, and filters outer air supplied through the outer air inflow unit 110. Such a filter unit 120 is provided below the outer air inflow unit 110 (omitted in FIG. 4), and thus may be provided in a direction substantially perpendicular to an outer air inflow direction of the outer air inflow unit 110.

The filter unit 120 may include the roll filter 121. The roll filter 121 may re-filter foreign substances included in outer air. Here, the roll filter 121 may have a rolled shape and be automatically replaced according to a contamination level of the roll filter 121. Thus, the roll filter 121 may be used for a long period of time after being installed once, and since replacement of a filtering member is simple, a replacement time of the roll filter 121 may be reduced. Such a roll filter 121 may be configured to be driven according to a difference in pressure between the front and the rear of a filter by providing a separate controller (not shown), and for example, may be set to be automatically driven by a differential pressure sensor within a pressure loss range of 7 mmAq to 20 mmAq. Also, at this time, a differential pressure range may be set by a user. Such a roll filter 121 may be formed of a material, such as stainless steel having excellent durability and anodized aluminum, and may be reusable after being washed several times based on a type of the filtering member.

Then, referring to FIGS. 1, 2, and 5, the mist ejection unit 130 may be provided at one side of the filter unit 120 and eject mist into outer air that has passed through the filter unit 120. In detail, the mist ejection unit 130 includes an ejection nozzle 131, and ejects minute particles of water, i.e., mist, into outer air that is fed in through the outer air inflow unit 110 such that a temperature and humidity inside the server room maintain a suitable level. In other words, by ejecting mist into the outer air, the mist ejection unit 130 increases low humidity that is a characteristic of outer air, and decreases a temperature of the outer air, thereby supplying air suitable for operating equipment into the server room. Such a mist ejection unit 130 may eject mist by increasing pressure of water by using a pump and directly ejecting the mist into outer air passing through the mist ejection unit 130 through the ejection nozzle 131. Here, in order to increase an effect of mist ejection, a distance between the ejection nozzle 131 and a cooling member 141 of the cooling unit 140 may be optimized. As such, by directly ejecting mist into outer air, a temperature of the outer air may be reduced by about 2 to 4° C., and thus an operating time of the cooling unit 140 may be reduced, thereby reducing energy consumption.

Meanwhile, the mist ejection unit 130 may further include a drain unit 133 for collecting condensed water. Such a drain unit 133 may be provided below the mist ejection unit 130 to smoothly externally discharge water that is condensed and collected at the bottom of the drain unit 133.

Meanwhile, the cooling unit 140 may be provided between the mist ejection unit 130 and the first supply unit 150 to cool the outer air that has passed through the mist ejection unit 130 once more. The cooling unit 140 may include the cooling member 141 that has a cooling coil shape, and at this time, the cooling member 141 may be an oval coil. In other words, the cooling member 141 may be a copper pipe having an oval shape and may be formed to reduce air resistance and at the same time, increase cooling performance at the back of the coil. Such an oval coil is suitable for energy reduction since a low static pressure is maintained even at a high wind speed.

In a general air-conditioning system of a data center, a thermostat used to generate cold air is generally provided at one side of a server room separately from a server room cooling device. In this case, since the thermostat is provided at one side of the server room, a separate space for disposing the thermostat in the data center is required, and in addition, a structure of the server room needs to be changed in order to connect the thermostat and the server room.

In contrast, in the server room cooling device 100 according to an embodiment and an air-conditioning system 1 (see FIGS. 7-10) of a data center, the air-conditioning system including the server room cooling device, the cooling unit 140 performing a function of a thermostat is provided inside the server room cooling device 100, and thus a separate space for disposing a thermostat is not required and space utility inside the data center is effectively increased. In addition, since a structure of a server room is not required to be changed in order to connect the server room and a thermostat, an existing structure of the data center is not changed and may be intactly used.

Then, referring to FIGS. 1, 2, and 6, the first supply unit 150 is provided at one side of the mist ejection unit 130 or the cooling unit 140 to supply outer air that has passed through the mist ejection unit 130 or the cooling unit 140 to a server room 200 (see FIGS. 7-10), particularly, to the bottom of the server room. The first supply unit 150 includes a first supply damper 151, and the first supply damper 151 controls opening and closing of the first supply unit 150 to control an amount of air supplied to the server room 200 through the first supply unit 150. An example of such a first supply damper 153 includes a motor damper (MD) that is automatically opened or closed by an electric motor or air pressure. Such a first supply damper 151 may immediately supply outer air into the server room 200 during an emergency, such as system malfunction, to prevent a temperature in the server room from increasing.

The second supply unit 160 may be provided at one side of the first supply unit 150 to supply outer air that has passed through the mist ejection unit 130 or the cooling unit 140 to the server room, particularly, to the top of the server room. Such a second supply unit 160 may be provided above the first supply unit 150. Such a second supply unit 160 may include a blast fan 161 and a second supply damper 163.

The blast fan 161 sucks outer air flowed in through the outer air inflow unit 110 in towards the second supply unit 160. In other words, by providing the blast fan 161 above a natural air path moving along the filter unit 120, the mist ejection unit 130, the cooling unit 140, and the first supply unit 150, which are provided linearly, reverse rotation of the blast fan 161 may be prevented, and a delay time is not required during a switching operation from the first supply unit 150 to the second supply unit 160.

As described below, the air-conditioning system 1 of a data center, according to an embodiment may include a plurality of the blast fans 161, and each of the blast fans 161 may be individually adjusted such that overall air volume is uniformly maintained even when some of the blast fans 161 malfunction by increasing air volume of the remaining of the blast fans 161.

Meanwhile, the second supply damper 163 controls opening and closing of the second supply unit 160 to control an amount of air supplied to the server room 200 through the second supply unit 160. An example of such a second supply damper 163 includes a motor damper (MD) that is automatically opened or closed by an electric motor or air pressure.

Figure 7:
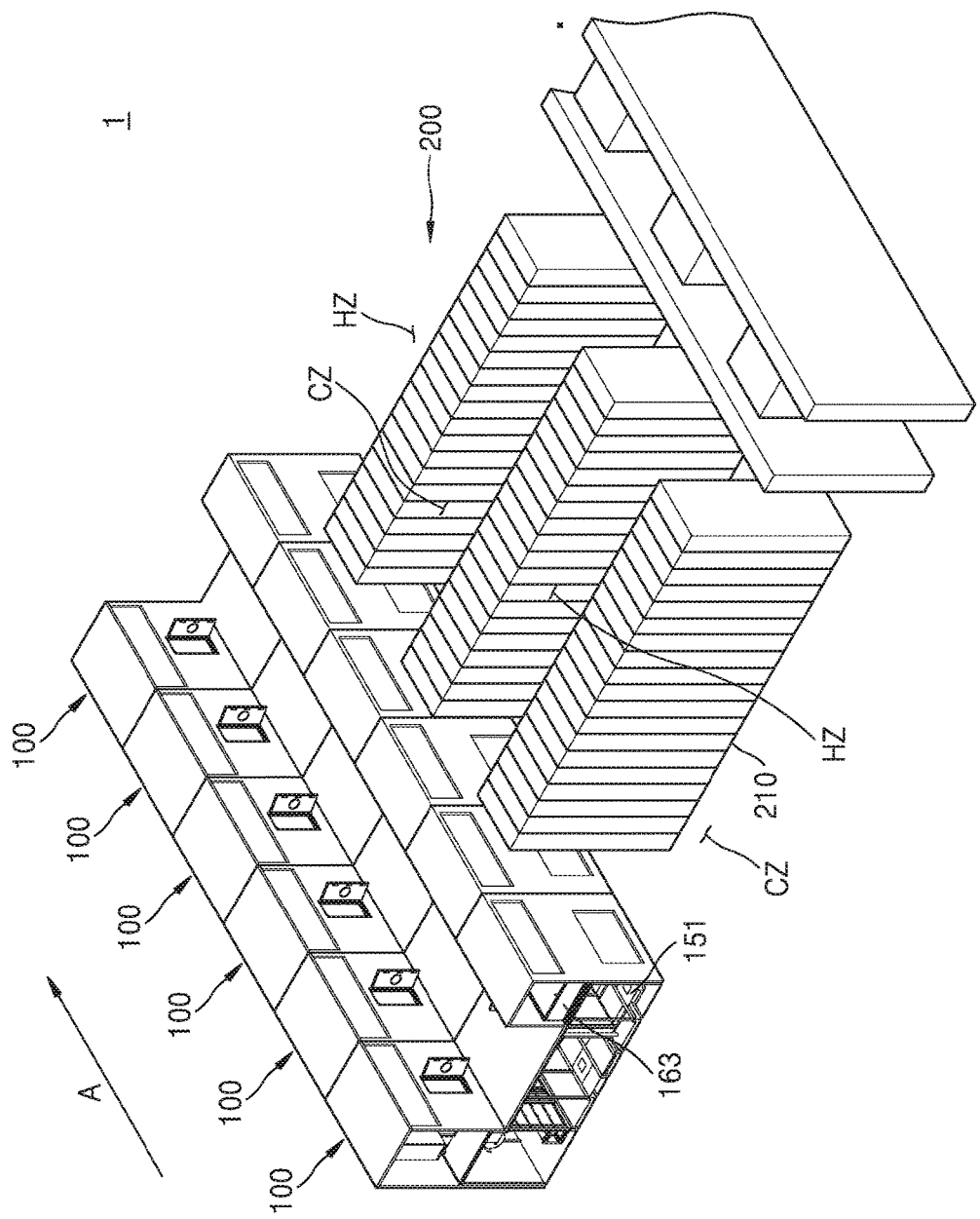
FIG. 7 is a perspective view of an air-conditioning system of a data center, according to an embodiment.

As such, by using the first supply unit 150 provided near the bottom of the server room cooling device 100 and the second supply unit 160 provided near the top of the server room cooling device 100 together, a supply structure of outer air may vary according to a structure of a server rack (see 210 of FIG. 7). Moreover, by using the first supply unit 150 provided near the bottom of the server room cooling device 100, a bottom space of the server rack (see 210 of FIG. 7), which is generally used as a cold air supply pipe, may be used as a part of the server rack (see 210 of FIG. 7), and thus the space of a server room 200 may be maintained.

In other words, in a general air-conditioning system of a data center, a space for supplying cold air needs to be provided below a server room in order to supply cold air to the server room. Thus, a certain space is left below the server room and a bottom surface for disposing a server thereon needs to be formed, and accordingly, a structure of the server room needs to be changed while changing a cooling method. Also, since a space in the server room is reduced as much as the space formed below the server room, space utility is decreased.

In contrast, in the server room cooling device according to an embodiment, and the air-conditioning system of a data center, the air-conditioning system including the server room cooling device, by using the first supply unit 150 provided below the server room cooling device 100 and the second supply unit 160 provided above the sever room cooling device 100 together, a separate space for supplying cold air below the server room is not required, and thus space utility inside the data center is effectively increased. Moreover, since the structure of the server room is not required to be changed in order to connect the server room and the server room cooling device, an existing structure of the data center is not changed and may be intactly used.

Meanwhile, although not illustrated in drawings, the server room cooling device 100 may further include a measurer (not shown) for measuring a temperature and humidity of outer air led in from the outer air inflow unit 110. For example, the measurer may include a temperature sensor for measuring a temperature and a humidity sensor for measuring humidity. Information about the temperature and the humidity of the outer air measured by the measurer may be transmitted to a controller (not shown).

The controller (not shown) adjusts an ejection amount of mist ejected from the mist ejection unit 130 such that outer air led in through the outer air inflow unit 110 maintains optimal temperature/humidity based on the information about the temperature and the humidity of the outer air received from the measurer (not shown), thereby cooling or moisturizing the flowed outer air.

For example, the controller (not shown) may reduce the temperature of the outer air by adjusting the ejection amount of the mist when it is determined that the inside of the server room needs to be cooled by comparing information about temperature/humidity inside the server room and the information about the temperature/humidity of the outer air. On the other hand, when it is determined that the temperature inside the server room is appropriate but the server room needs to be humidified, the controller may adjust the ejection amount of the mist to increase the humidity of the outer air supplied into the server room.

Figure 8:
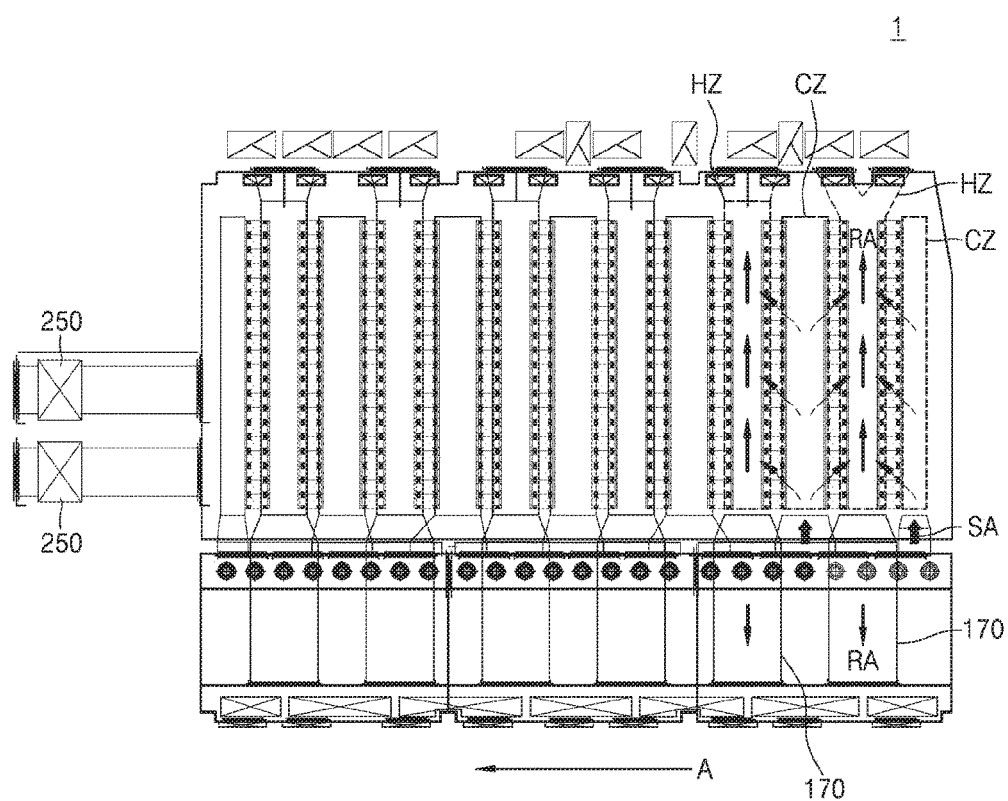
FIG. 8 is a plan view of the air-conditioning system of the data center of FIG. 7.
Figure 9:
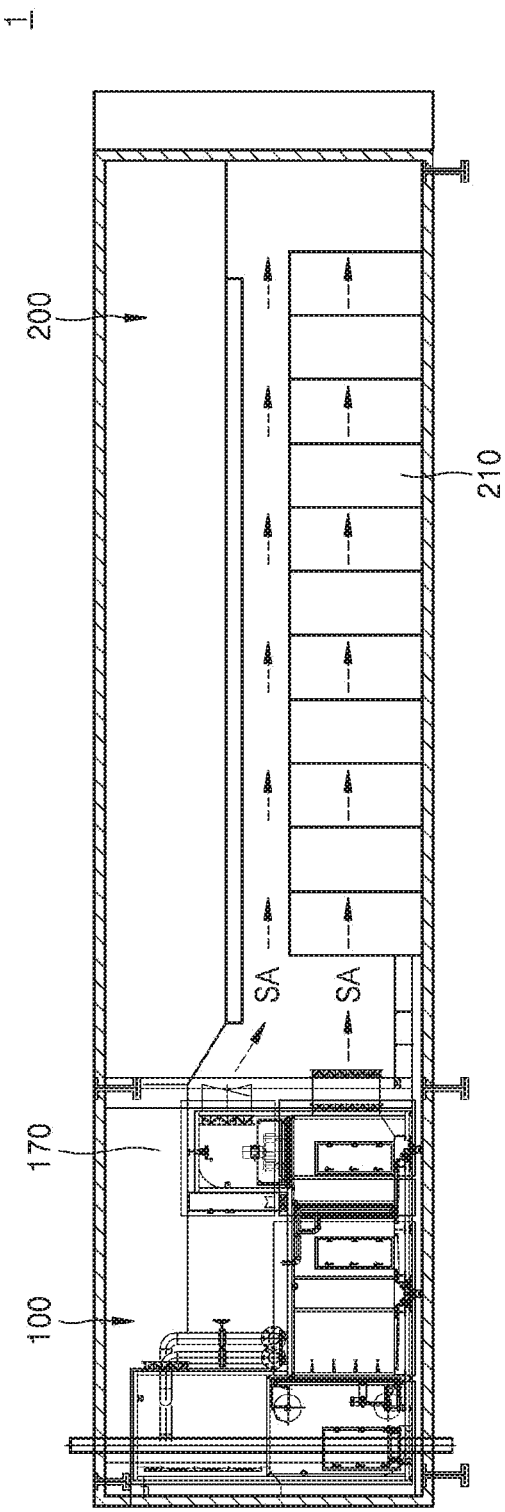
FIG. 9 is a lateral view of a cool zone of the air-conditioning system of the data center of FIG. 7.

FIG. 7 is a perspective view of an air-conditioning system of a data center, according to an embodiment, and FIG. 8 is a plan view of the air-conditioning system of the data center of FIG. 7. FIG. 9 is a lateral view of a cool zone of the air-conditioning system of the data center of FIG. 7, and FIG. 10 is a lateral view of a hot zone of the air-conditioning system of the data center of FIG. 7.

Figure 10:
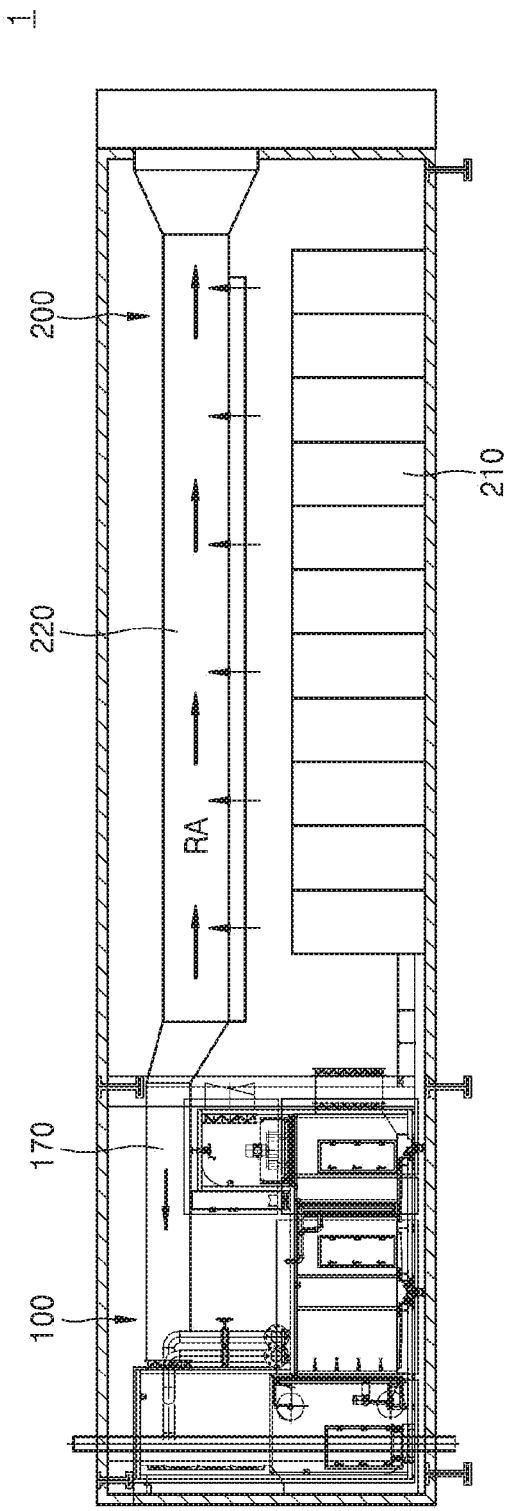
FIG. 10 is a lateral view of a hot zone of the air-conditioning system of the data center of FIG. 7.

Here, cold air (supply air SA) of FIG. 9 shows an air flow in a cool zone CZ, and hot air (return air RA) of FIG. 10 shows an air flow in a hot zone HZ.

Referring to FIGS. 7 through 10, the air-conditioning system 1 of the data center, the air-conditioning system 1 including the server room cooling device 100, includes the server room 200, a plurality of server racks 210 arranged along a first direction (A direction) in the server room 200, and at least one server room cooling device 100 provided at one side of the server room 200, into which outer air flows, and supplying the outer air to the server room 200.

Here, a plurality of servers may be provided in each of the server racks 210, wherein spaces between the server racks 210 may be alternately the hot zone HZ and the cool zone CZ. Here, the cool zone CZ may receive cold air from the server room cooling device 100 by being connected to the server room cooling device 100. Cold air supplied to the cool zone CZ flows to the server rack 210, is heated by the plurality of servers included in the server rack 210 while passing through the plurality of servers, and then is externally discharged through the hot zone HZ and a discharging unit 220 connected to the hot zone HZ or is supplied back to the server room cooling device 100. Accordingly, the cool zone CZ is connected to, and open to the flow of cold air from, the server room cooling device 100, and the hot zone HZ is blocked with respect to the flow of cold air from the server room cooling device 100. Here, in FIG. 7, the hot zone HZ and the cool zone CZ are illustrates as if they communicate with each other for convenience of illustration, and the hot zone HZ and the cool zone CZ may communicate with each other, but for efficient cooling of a server, the hot zone HZ and the cool zone CZ may be blocked from each other, the cool zone CZ may be connected to the server room cooling device 100 to receive cold air (supply air SA) from the server room cooling device 100, and the hot zone HZ may be blocked with respect to the server room cooling device 100 such that hot air (return air RA) is discharged through the discharging unit 220 provided above the server room 200.

In detail, cold air (supply air SA) supplied to the cool zone CZ of the server room 200 is supplied to each of a series of the server racks 210, and hot air (return air RA) discharged from the server rack 210 flows to the discharging unit 220 provided above the server room 200 through the hot zone HZ. Air flowed to the discharging unit 220 may be flowed again to the server room cooling device 100 or discharged outside the server room 200 as occasion demands.

Here, the discharging unit 220 is provided above the server room 200 to discharge air inside the server room 200. An example of the discharging unit 220 includes a duct, and when cold air supplied from the server room cooling device 100 is heated through the server rack 210 included in the server room 200 and then lifted above the server room 200, the discharging unit 220 may suck the heated air and discharge the heated air outside the server room 200.

The discharging unit 220 of such a server room 200 may be connected to the return duct unit 170 of the server room cooling device 100. Accordingly, hot air discharged from the server room 200 according to control of the controller flows to the server room cooling device 100 through the discharging unit 220 and the return duct unit 170, and thus outer air and air inside the server room 200 may be mixed. At this time, the mist ejection unit 130 may spray mist into the mixed air such that the server room 200 is efficiently cooled or humidified.

Meanwhile, a plurality of the server room cooling devices 100 may be provided along the first direction (A direction of FIG. 7). Also, the plurality of server room cooling device 100 may be opened such that air flows therebetween. In other words, side walls of the neighboring server room cooling devices 100 may be opened such that air flows between the server room cooling devices 100. Accordingly, the air-conditioning system 1 including the plurality of server room cooling devices 100 may be integrally operated. In other words, as will be described later, a plurality of blast fans (see 161 of FIG. 5) may be provided such that air volume of the blast fans (see 161 of FIG. 5) is individually adjusted, and thus overall air volume may be uniformly maintained even when some of the blast fans (see 161 of FIG. 5) malfunction, by increasing air volume of the remaining of the blast fans (see 161 of FIG. 5).

As such, by using the plurality of server room cooling devices 100 that communicate with each other, it is possible to use an entire space outside the server room 200 as one cooling apparatus, and thus conveyance power may be reduced by reducing air resistance, a surrounding environment is not complex since a duct is not provided in the cooling apparatus, and a maintenance space may be secured. Moreover, noise and vibration in equipment may be reduced as an air current is stabilized, a service life of the equipment may be increased, and a static pressure loss may be reduced according to a stabilized air flow. Also, the air-conditioning system 1 according to an embodiment has a mixed structure of a built up structure and a package structure, and thus has both excellent space utility that is an advantage of the built up structure and excellent air-tightness and excellent insulation, which are advantages of the package structure.

Meanwhile, at least one outer air introducing filter module 250 may be further provided at one side of the server room 200. The outer air introducing filter module 250 leads air outside the data center into the server room 200. Although not illustrated in drawings, the outer air introducing filter module 250 may include an OA damper, a mesh, a demister filter, and a roll filter such that foreign substances included in outer air do not enter the server room 200.

Here, the outer air introducing filter module 250 may be provided immediately on one side surface of the server room 200 to directly supply outer air to the server room 200. Also, a plurality of the outer air introducing filter module 250 may be provided, wherein the plurality of outer air introducing filter modules 250 are arranged in parallel along one direction (a direction perpendicular to an arrow A in drawings).

As such, by providing the at least one outer air introducing filter module 250 for leading outer air into the server room 200 at one side of the server room 200, an amount of outer air introduced into the data center may be maximized. In addition, during an emergency, such as system malfunction, outer air may be immediately provided into the server room such that a temperature in the server room is prevented from increasing.

Particularly, in the server room cooling device according to an embodiment and the air-conditioning system of the data center, the air-conditioning system including the server room cooling device, the cooling unit (see 140 of FIG. 5) operating as a thermostat is provided inside the server room cooling device 100, and thus a separate space for disposing a thermostat is not required, and accordingly, space utility inside the data center may be further increased.

Although not illustrated in drawings, the server room cooling device 100 may further include a thermostat, and even at this time, the server room cooling device 100 may include at least one outer air introducing filter module at one side of the server room, thereby maximizing an amount of outer air introduced into the data center and at the same time, preventing a temperature in the server room from increasing by supplying outer air immediately into the server room during an emergency.

Hereinafter, a method of operating such an air-conditioning system 1 of the data center will be described in detail.

Outer air outside the data center is led into the server room cooling device 100 through the outer air inflow unit 110 of the server room cooling device 100. Here, foreign substances included in the outer air may be blocked through the outer air inflow unit 110 and the filter unit 120. The outer air from which the foreign substances are blocked may pass through the mist ejection unit 130 of the server room cooling device 100 to be cooled or humidified by mist sprayed from the mist ejection unit 130. Then, the cooled or humidified outer air is supplied to the server room 200 through the first supply unit 150 and/or the second supply unit 160 provided at one side of the server room cooling device 100. Here, when a temperature of the outer air is equal to or higher than a pre-set value, the server room cooling device 100 may activate the cooling member 141 included in the cooling unit 140 of the server room cooling device 100 such that cold air is supplied into the server room 200.

Then, the cold air supplied to the cool zone CZ of the server room 200 is led to the server rack 210 included in the server room 200, is heated by the plurality of servers included in the server rack 210, is discharged to the hot zone HZ, and then is discharged outside the server room through the discharging unit 220 provided above the hot zone HZ. At this time, some of the air discharged to the discharging unit 220 may be supplied again to the outer air inflow unit 110 through the return duct unit 170 of the server room cooling device 100 as occasion demands.

According to the disclosure, by reducing the number of pieces of equipment included in the air-conditioning system of the data center, space may be efficiently used. Also, by reducing an interval between the mist ejection unit 130 and the cooling unit 140, a cooling efficiency by ejecting mist may be increased. Also, power for flowing outer air may be reduced by reducing a curve of an outer air path to obtain a natural air current space. Moreover, since cooling is possible by using only secondary exhaust power without having to use primary electric power, energy consumption may be reduced as an amount of outer air supplied into the server room is increased.

While one or more embodiments have been described with reference to the figures, it will be understood by those of ordinary skill in the art that various changes in form and details may be made therein without departing from the spirit and scope of the inventive concept as defined by the following claims.

INDUSTRIAL APPLICABILITY

Embodiments of the disclosure may be used in a server room cooling device for cooling a server room by using external natural air, and an air-conditioning system of a data center, the air-conditioning system including the server room cooling device.

The invention claimed is:

1. A server room cooling device comprising:
an outer air inflow unit into which outer air flows;
a filter unit provided at one side of the outer air inflow unit and filtering the outer air supplied through the outer air inflow unit;
a mist ejection unit provided at one side of the filter unit and ejecting mist into the outer air that has passed through the filter unit;
a cooling unit provided at one side of the mist ejection unit and cooling the outer air that has passed through the mist election unit; and
a supply unit supplying the outer air that has passed through the mist ejection unit to a server room;
wherein the supply unit comprises:
a first supply unit supplying the outer air that has passed through the cooling unit into a lower portion of the server room; and
a second supply unit provided at one side of the first supply unit and supplying at least a part of the outer air to an upper portion of the server room,
wherein the second supply unit is provided in a direction substantially perpendicular to an outer air inflow direction of the outer air inflow unit, with respect to the first supply unit, such that the outer air is supplied from the first supply unit to the second supply unit in the direction perpendicular to the outer air inflow direction of the outer air inflow unit,
wherein the server room is cooled at least in part by the outer air that is supplied from the first supply unit to the upper portion of the server room via the second supply unit.

2. The server room cooling device of claim 1, wherein the outer air inflow unit comprises a first damper controlling closing and opening of the outer air inflow unit.

3. The server room cooling device of claim 2, wherein the outer air inflow unit further comprises at least one demister filter blocking moisture or a foreign substance included in the outer air, wherein the demister filter is provided at one side of the first damper.

4. The server room cooling device of claim 3, wherein a plurality of the demister filters are provided, wherein the plurality of demister filters are arranged at one side of the first damper in a zigzag shape.

5. The server room cooling device of claim 1, wherein a return duct unit to which return air that has passed through the server room is supplied is connected to the outer air inflow unit.

6. The server room cooling device of claim 5, wherein a second damper controlling air flow between the outer air inflow unit and the return duct unit is provided between the outer air inflow unit and the return duct unit.

7. The server room cooling device of claim 1, wherein the filter unit is provided in a direction substantially perpendicular to an outer air inflow direction of the outer air inflow unit, with respect to the outer air inflow unit.

8. The server room cooling device of claim 1, wherein the cooling unit is provided inside the server room cooling device.

9. The server room cooling device of claim 1, wherein a first supply damper controlling an air flow between the first supply unit and the server room is provided between the first supply unit and the server room.

10. The server room cooling device of claim 9, wherein, when the first supply damper is opened, the outer air that flows into the outer air inflow unit is supplied into the server room.

11. The server room cooling device of claim 1, wherein the second supply unit comprises a fan for guiding a flow of the outer air such that at least a part of the outer air is supplied from the first supply unit into the second supply unit.

12. The server room cooling device of claim 1, wherein a second supply damper controlling an air flow between the second supply unit and the server room is provided between the second supply unit and the server room.

13. The server room cooling device of claim 1, wherein the filter unit, the mist ejection unit, and the supply unit are arranged linearly.

14. The server room cooling device of claim 1, wherein the server room cooling device is provided at one side of the server room comprising a plurality of server racks arranged along a first direction to supply the outer air to the server room.

15. The server room cooling device of claim 14, wherein a plurality of the server room cooling devices are provided along the first direction,
wherein the plurality of server room cooling devices are opened such that air flows therebetween.

16. The server room cooling device of claim 15, wherein, when any one of the first and second supply units of the plurality of server room cooling devices malfunctions, air volume of remaining first and second supply units is increased to uniformly maintain total air volume.

17. The server room cooling device of claim 14, wherein at least a part of the supply unit is provided to face the plurality of server racks in the server room.

18. The server room cooling device of claim 14, wherein at least one cool zone, which is provided in a space between neighboring server racks and receiving the outer air from the server room cooling device, is opened with respect to the server room cooling device,
at least one hot zone, which is provided in a space between neighboring server racks and discharging the outer air received by the at least one cool zone after the outer air passes through servers included in the plurality of server racks, is blocked with respect to the server room cooling device, and
the at least one cool zone and the at least one hot zone are alternately provided.

* * * * *